United States Patent [19]
Murakami et al.

[11] Patent Number: 4,655,598
[45] Date of Patent: Apr. 7, 1987

[54] POSITION DETECTION METHOD AND APPARATUS

[75] Inventors: Seiro Murakami, Tokyo; Toshio Matsuura, Koshigaya; Yuji Imai, Tokyo; Kazuya Ohta, Kawasaki, all of Japan

[73] Assignee: Nippon Kogaku K.K., Tokyo, Japan

[21] Appl. No.: 799,262

[22] Filed: Nov. 18, 1985

[30] Foreign Application Priority Data

Nov. 26, 1984 [JP] Japan ................................ 59-249291

[51] Int. Cl.$^4$ ............................................. G01B 11/00
[52] U.S. Cl. ..................................... 356/400; 356/401
[58] Field of Search ................................. 356/400, 401

[56] References Cited
U.S. PATENT DOCUMENTS 4,112,309  9/1978  Nakazawa et al. ................ 250/560
4,611,122  9/1986  Nakano et al. .................. 356/401 X Primary Examiner—Eugene R. LaRoche
Assistant Examiner—David Mis
Attorney, Agent, or Firm—Shapiro and Shapiro

[57] ABSTRACT

Position detecting method and a apparatus detect a position of substrate formed with a diffraction grating mark and a linearly extending stepped edge mark spaced from the diffraction grating. In the method and apparatus, those marks are relatively scanned by light beam, and position of the substrate is detected based on light information generated by both the marks and the scanning position.

12 Claims, 24 Drawing Figures

F I G. 3
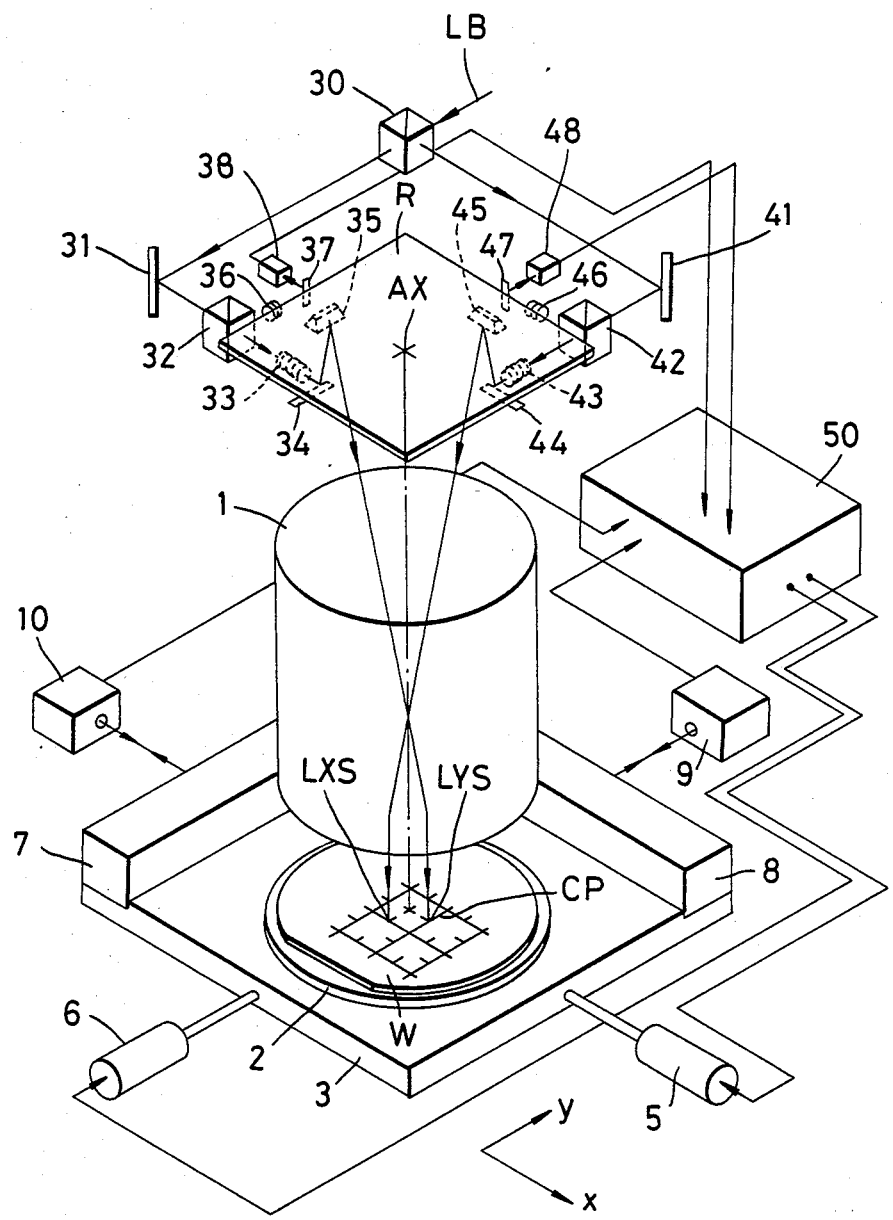

F I G.12
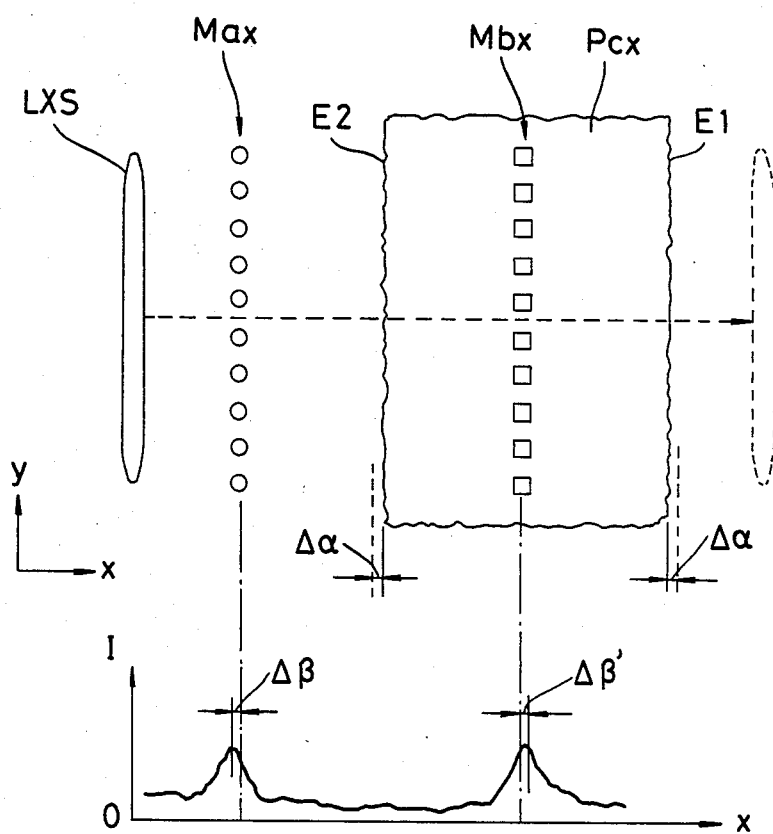

FIG.13a
FIG.13b
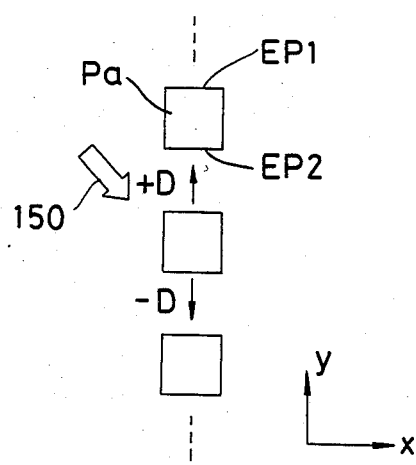
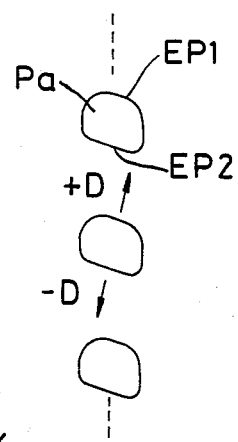
FIG.14a
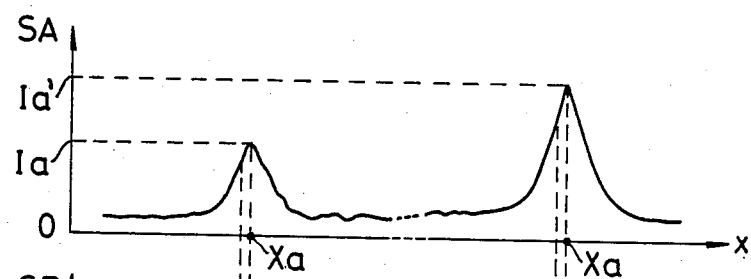
FIG.14b
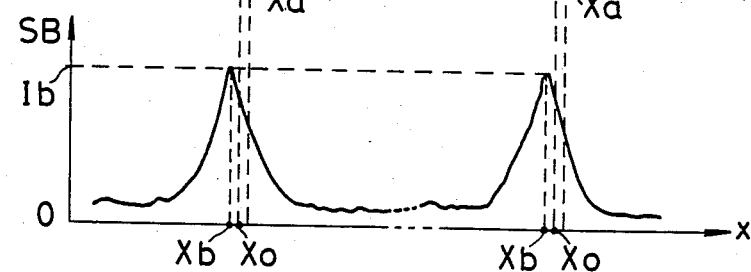

POSITION DETECTION METHOD AND APPARATUS

BACKGROUND OF THE INVENTION

1. Field of the Invention

The present invention relates to method and apparatus for detecting a position of a substrate by detecting a mark put on the substrate, and more particularly to method and apparatus suitable for detecting a position of a semiconductor wafer on an exposure apparatus for manufacturing a semiconductor device, laser repair apparatus or test apparatus.

2. Description of the Prior Art

Microminiturization of a large scale integrated circuit (LSI) pattern has been advancing year by year, and various projection type exposure apparatus which transfer a pattern on a mask (or reticle) onto a semiconductor wafer with unity magnification or at a reduced scale, have been used as circuit pattern print apparatus which meet requirements on microminiturization and which have a high productivity.

In the manufacture of the LSI, several or more pattern layers are sequentially formed on the wafer. If an alignment error (positional error) between the layers is not within a predetermined range, an intended conduction or insulation condition between the layers is not attained and the LSI does not perform its intended function. For example, for a circuit having a minimum line width of 1 $\mu$m, only a positional error of 0.2 $\mu$m at most is permitted. Accordingly, in the projection type exposure apparatus, various high precision alignment methods have been proposed to align a projection image of a pattern on the mask (or reticle) to a pattern (chip) formed on the wafer.

Most of those alignment methods optically detect an alignment key mark formed on the wafer. Accordingly, in many cases, the alignment precision depends on the alignment mark on the wafer. The affect of the wafer process to the alignment mark is larger in later step of the process, and the geometry of the mark is more degraded in the later step. This means that a photo-electric signal detected from the mark includes a distortion due to the geometry degradation together with a high optical reflection factor on a surface of a metalized (Al) wiring layer in the latter step of the process of the optical alignment. As a result, the precision of position detection of the mark is lowered and the alignment precision is lowered. Since a higher alignment precision is required as the wafer process proceeds, the alignment is not done in a good condition because of the lower precision due to the degradation of the mark geometry, and a yield of the chip is reduced.

SUMMARY OF THE INVENTION

It is an object of the present invention to provide position detection method and apparatus which allow high precision and high speed position detection even for a substrate whose surface geometry is degraded during a process.

It is another object of the present invention to provide position detection method and apparatus in which a diffraction grating and a stepped edge are provided on a substrate in a predetermined positional relationship, and a position of generation of a scattered light (or normal reflection light) from the stepped edge is determined based on a position of generation of a diffraction light from the diffraction grating so that an edge position is determined with a high precision from the low S/N ratio scattered light (or normal reflection light) information.

It is other object of the present invention to provide position detection method and apparatus which separately detect diffraction light information and scattered light information so that an optimum detection algorithm is applied to both signal processing based on the diffraction light information and signal processing based on the scattered light information.

BRIEF DESCRIPTION OF THE DRAWINGS

FIG. 3 is a perspective view of a projection type exposure apparatus which uses the position detection apparatus of the present invention, FIG. 12 shows a geometry of the alignment mark affected by the process and an intensity distribution of the diffraction light, FIGS. 13a–13b is a plan view illustrating the affect to the diffraction grating pattern by the process, FIGS. 14a–14b show waveforms for illustrating gain control of photo-electric signals SA and SB of the diffraction light information.

DETAILED DESCRIPTION OF THE PREFERRED EMBODIMENTS

Figure 1:
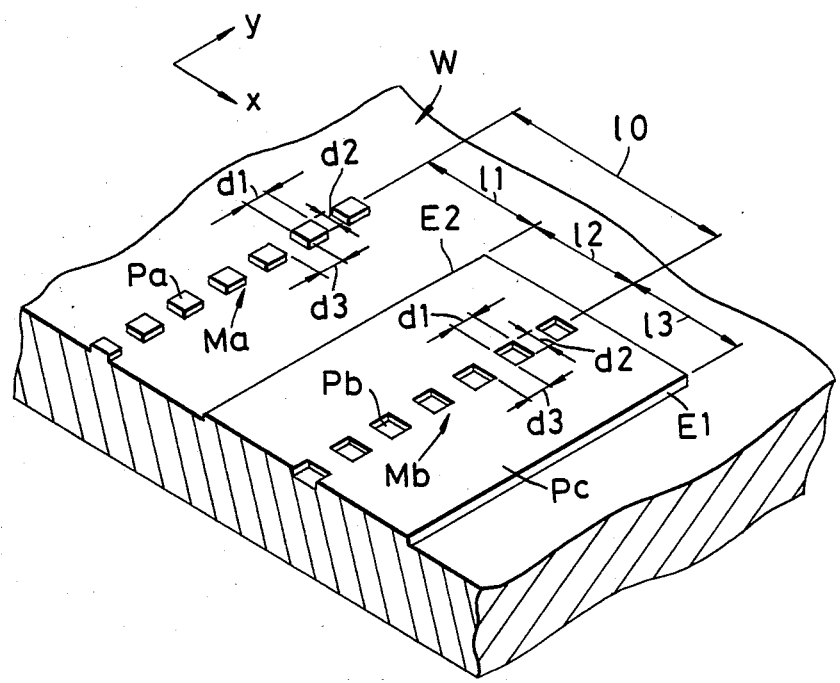
FIG. 1 is a partial perspective view of a geometry of an alignment mark used in the present invention.

FIG. 1 is an enlarged perspective view, partially in section, showing a geometry of an alignment mark on a wafer in accordance with an embodiment of the present invention. The mark of the present invention has a pair of diffraction grating marks Ma and Mb formed on the wafer.

The marks Ma and Mb have small rectangular patterns (grating elements) Pa and Pb, respectively, arranged at a constant pitch in a y-direction of an x-y coordinate to allow x-direction position detection. The rectangular patterns Pa of the mark Ma are projecting patterns on the surface of the wafer W and each rectangular pattern Pa has a y-direction width of $d_1$ and an x-direction width of $d_2$. A spacing between the patterns Pa is $d_3$. The widths $d_1$ and $d_2$ and the spacing $d_3$ are selected such that a diffraction light is generated efficiently by the irradiation of the alignment light beam. On the other hand, a projecting rectangular area (land) Pc is formed on the surface of the wafer W adjacently to the mark Ma. The rectangular area Pc has stepped edges $E_1$ and $E_2$ which continuously extend along the y-direction. In the present embodiment, a height of the rectangular area Pc is equal to a height of the rectangular patterns Pa of the mark Ma. The mark Mb extending in the y-direction is formed in the rectangular area Pc. The mark Mb has small rectangular patterns Pb which have the same shape and dimension as those of the rectangular patterns Pa of the mark Ma but the rectangular patterns Pb are recessed. The recessed grating patterns of the mark Mb also generate a diffraction light when they are irradiated by the alignment light beam.

In the present embodiment, a distance between a center axis of the mark Ma along the x-direction and a center axis of the mark Mb along the x-direction is $l_0$, a distance between the center axis of the mark Ma and the stepped edge $E_2$ is $l_1$, and distances between the center axis of the mark Mb and the stepped edges $E_1$ and $E_2$ are $l_3$ and $l_2$, respectively.

Figure 2:
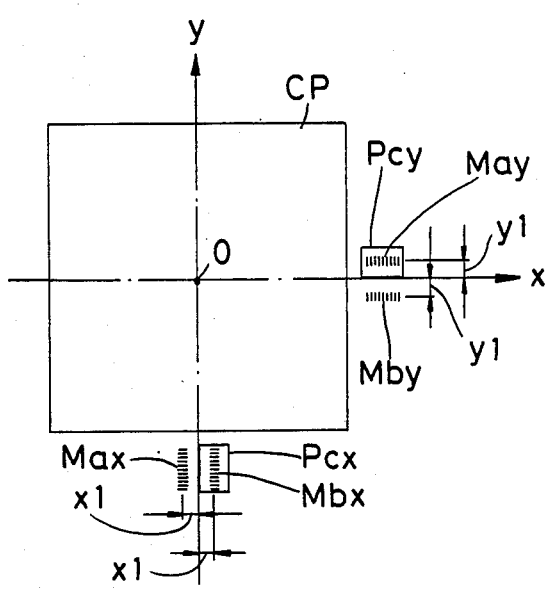
FIG. 2 is a plan view showing a positional relationship between a chip on a wafer and an alignment mark.

The marks Ma and Mb and the rectangular area Pc (which are collectively called an alignment mark) are formed in the course of exposure process of a first layer to the wafer W. FIG. 2 is a plan view showing the arrangement of the alignment mark formed on the wafer W. In the present embodiment, the first layer is exposed by a reduction projection type exposure apparatus (stepper) and the alignment marks in the x-direction and y-direction are formed for each chip area CP on the wafer W. A reticle for the first layer has a pattern for forming the mark shown in FIG. 1. The chip area CP is arranged in matrix on the wafer W and corresponds to one exposure field (shot) of the reduction projection type exposure apparatus. The chip area CP may include one circuit pattern or a plurality of circuit patterns of the same design (multi-die). When an x-y coordinate is defined with a center O of the chip area CP being an origin, the alignment mark used for the x-direction position detection is positioned on the y-axis and the alignment mark used for the y-direction position detection is positioned on the x-axis. The x-direction alignment mark comprises marks Max, Mbx and a rectangular area Pcx like that shown in FIG. 1, and the y-direction alignment mark similarly comprises marks May and Mby and a rectangular area Pcy extending in the x-direction. In the present embodiment, in order to simplify the description, it is assumed that the y-axis passes through a point which is spaced by a distance $x_1$ from both of the marks Max and Mby ($x_1 = l_0/2$), and the x-axis passes through a point which is spaced by a distance $y_1$ from both of the marks May and Mby ($y_1 = l_0/2$). By photo-electrically detecting those two alignment marks and measuring the positions of the marks, two-dimensional alignment of projection images of the second and subsequent circuit patterns and the chip area CP. In the present embodiment, the pair of diffraction grating marks Ma and Mb having the same shape and dimension, one projecting and the other being recessed, are formed on the wafer W in order to suppress reduction of the detection precision due to a waveform distortion of the photo-electric signal by the deformation or degradation of the mark geometry as the wafer process proceeds or by the uneven thickness of applied photoresist (photo-sensitive material). The projecting mark and the recessed mark, even if their shapes and the dimensions are equal, are differently affected by the process and the resist. Accordingly, even if one of the projecting and recessed marks is significantly deformed, there is a high possibility that the geometry of the other mark is retained. Thus, by selecting the less deformed mark, the reduction of the detection precision can be suppressed.

FIG. 3 is a perspective view of a reduction projection type exposure apparatus suitable for incorporation in the position detection apparatus of the present invention. A reticle R which is an original plate to be projected is mounted on the apparatus such that a projection center thereof passes through an optical axis AX of a projection lens 1. The projection lens 1 projects a circuit pattern image drawn on the reticle R onto a wafer W at a reduction factor of 1/5 or 1/10. A wafer holder 2 vacuum-chucks the wafer W and is finely movable to a stage 3 which is two-dimensionally moved in the x-direction and y-direction. The x-direction movement of the stage 3 is done by a motor 5 and the y-direction movement is done by a motor 6. A reflection mirror 7 having a reflection plane extending in the y-direction and a reflection mirror 8 having a reflection plane extending in the x-direction are fixed to two orthogonal sides of the stage 3. A laser interferometer 9 projects a laser beam to the reflection mirror 8 to detect a y-direction position (or displacement) of the stage 3, and the laser interferometer 10 projects a laser beam to the reflection mirror 7 to detect an x-direction position (or displacement) of the stage 3.

The present apparatus has a laser step alignment (LSA) optical system for detecting a mark on the wafer W through the projection lens. A laser beam LB emitted from a laser beam source (not shown) and passed through an expander and a cylindrical lens (not shown) has a wavelength which is not sensed by a photoresist, and it is divided into two light beams by a beam splitter 30. One of the laser beams is reflected by a mirror 31, passes through a beam splitter 32 and focused by a focusing lens 33 such that a cross-section thereof is of belt shape. Then, the laser beam is directed to a first mirror 34 arranged between the reticle R and the projection lens 1 so that it does not interrupt a projection path of the circuit pattern. The first mirror 34 reflects the laser beam toward the reticle R. The laser beam is directed to a mirror 35 which is arranged below the reticle R and a reflection plane parallel to the surface of the reticle R and, reflected toward a center of an incident pupil of the projection lens 1. The laser beam from the mirror 35 is focused by the projection lens 1 onto the wafer W as a belt-shaped spot light (strictly describing, an elliptical-shaped spot light of striped pattern of several lens to several ten μms.) LYS extending in the x-direction. The spot light LYS scans the diffraction grating marks May and Mby extending on the x-direction on the wafer W or the stepped edges $E_1$ and $E_2$ of the rectangular area Pcy in the y-direction to detect the position of the y-direction alignment mark. As the spot light LSY illuminates the y-direction alignment mark, a diffraction light and a scattered light (reflection light) are generated from the alignment mark. The light information passes through the lens 1, mirror 35, mirror 34, focusing lens 33 and beam splitter 32, is reflected by the beam splitter 32 and directed to a photo-electric detector 38 through a lens 36 and a mirror 37. The photo-electric detector 38 produces photo-electric signals which represent a light intensity of the incident diffraction light and a light intensity of the incident scattered light, respectively. The mirror 31, beam splitter 32, focusing lens 33, mirrors 34 and 35, lens 36, mirror 37 and photo-electric detector 38 form a through-the-lens type alignment optical system (Y-LSA system).

On the other hand, the other laser beam split by the beam splitter 30 is directed to a through-the-lens type alignment optical system (X-LSA system) which detects the position of the X-direction alignment mark on the wafer W. The X-LSA system comprises mirror 41, beam splitter 42, focusing lens 43, mirrors 44 and 45, lens 46, mirror 47 and photo-electric detector 48, like the Y-LSA system and focuses a belt-shaped (stripe-shaped) spot light LXS extending in the y-direction on the wafer W.

A main control unit 50 receives the photo-electric signals from the photo-electric detectors 38 and 48 and the position information from the laser interferometers 9 and 10 to process the information for position detection and positioning and issue commands to drive the motors 5 and 6. The main control unit 50 has a processor such as a microcomputer or minicomputer and stores therein design position information of chip areas CP formed on the wafer (chip arrangement coordinates on the wafer W) and design position and dimension of the alignment mark.

Figure 4:
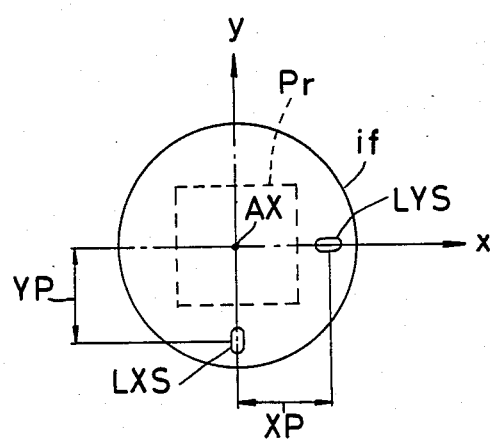
FIG. 4 is a plan view showing a positional relationship between an image field of a projection lens and a spot light.

FIG. 4 is a plan view showing the arrangement of the two spot lights LYS and LXS on the wafer W. A circle area shows a view field (image field) if of the projection lens 1. When the reticle R is precisely positioned to the apparatus, the projection image of the circuit pattern of the reticle R is a rectangular area Pr through a center of which the optical axis AX passes. The area Pr may be as large as to internally contact to the image field if. If the coordinate axes are defined such that the optical axis AX passes through the origin point of the x-y movement coordinate (orthogonal coordinate) of the stage 3, the spot light LXS is located at a position on the y-axis spaced by a distance YP from the optical axis AX, and the spot light LYS is located at a point on the x-axis spaced by a distance XP from the optical axis AX.

Figure 5:
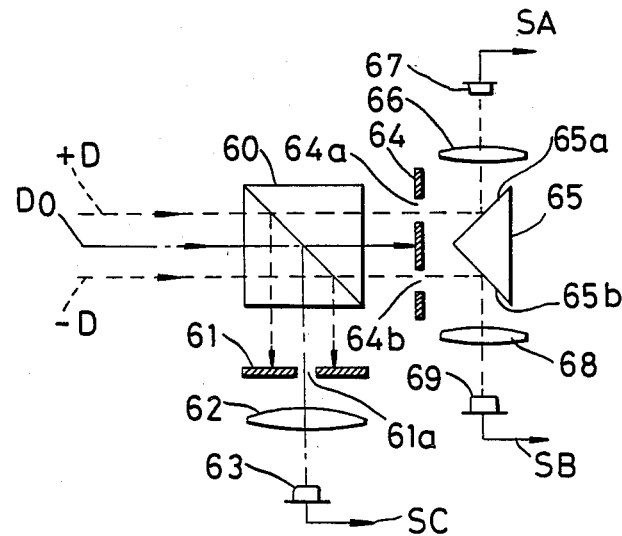
FIG. 5 shows a photo-electric detection unit.

FIG. 5 shows an embodiment of the photo-electric detectors 38 and 48. Since both photo-electric detectors are identical in construction, only the photo-electric detector 48 is shown. The light information from the x-direction alignment mark reflected by a mirror 47 includes diffraction lights ±D (±1-order lights, ±2-order lights, ±3-order lights, etc.) generated by the marks Max and Mbx, diffraction light $D_0$ from the stepped edges $E_1$ and $E_2$ or steps of the marks Max and Mbx parallel to the edges $E_1$ and $E_2$, and normal reflection light. The light information is divided into two by a beam splitter 60, and one of the light information is directed to a spatial filter 61 arranged in conjugation with an incident pupil of the projection lens 1 so that only a scattered light $D_0$ is extracted from an aperture 61a and focused to a plane of a photo-electric element 63 through a condenser lens 62. The other light information from the beam splitter 60 is directed to a spatial filter 64 arranged in conjugation with the incident pupil of the projection lens 1 and only the diffraction lights ±D from the marks Max and Mby are extracted from apertures 64a and 64b. The diffraction lights ±D are directed to a prism-like glass block 65 having two reflection surfaces 65a and 65b. On the reflection surface 65a, the diffraction light +D (+1-order light, +2-order light, +3-order light) is reflected and it is focused to a plane of a photo-electric element 67 through a condensing lens 66. On the other hand, on the reflection surface 65b, the diffraction light −D (−1-order light, −2-order light, −3-order light) is reflected and it is focused to a plane of a photo-electric element 69 through a condensing lens 68.

Figure 6:
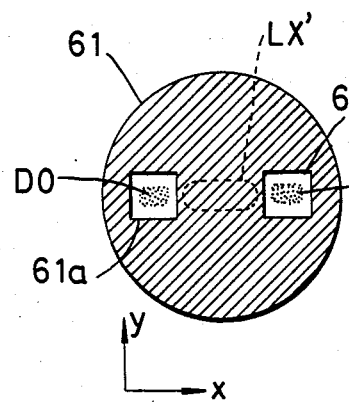
FIG. 6 is a plan view of a spatial filter for detecting a scattered light.
Figure 7:
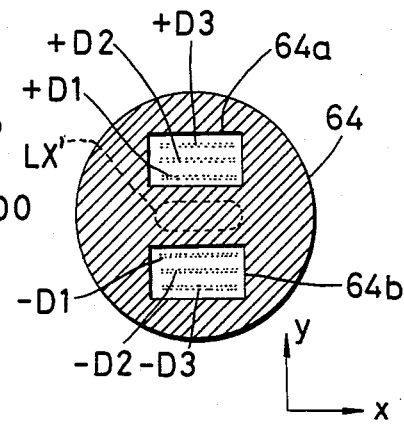
FIG. 7 is a plan view of a spatial filter for detecting a diffraction light.

FIGS. 6 and 7 are plan views showing the shapes of the spatial filters 61 and 64, respectively. In FIG. 6, a light beam distribution LX' on the incident pupil of the normal reflection light of the spot light LXS is shown at the center of the spatial filter 61. The spatial filter 61 is conjugate with the incident pupil of the projection lens 1, and the light beam distribution LX' extends orthogonally to the spot light LXS on the spatial filter 61 because the light transmission system for the laser beam includes the cylindrical lens. The spatial filter 61 has apertures 61a and 61b which block the normal reflection light and transmit the scattered light $D_0$ generated when the spot light LXS is illuminated to the stepped edges $E_1$ and $E_2$. The apertures 61a and 61b are arranged symmetrically around a longitudinal center axis of the spot light LXS, that is, on the left and right of the light beam distribution LX'. On the other hand, the spatial filter 64 shown in FIG. 7 is also arranged in conjugation with the incident pupil of the projection lens 1 and the light beam distribution LX' of the normal reflection light from the wafer W of the spot light LXS extends orthogonally to the spot light LXS on the spatial filter 64. The spatial filter 64 has apertures 64a and 64b which block the normal reflection light and transmit the diffraction lights ±D from the marks Ma and Mb. The aperture 64a is designed to transmit the +1-order light (+D1), +2-order light (+D2) and +3-order light (+D3) from the marks Ma and Mb, and the aperture 64b is designed to transmit the −1-order light (−D1), −2-order light (−D2) and −3-order light (−D3). As the diffraction lights +D are divided into the plus order light and the minus order light and sensed by the different photo-electric elements 67 and 69, photo-electric signals SA and SB from the photo-electric elements 67 and 69 can be separately processed so that the reduction of the position detection precision due to the change or degradation of the diffraction grating pattern can be suppressed.

Figure 8:
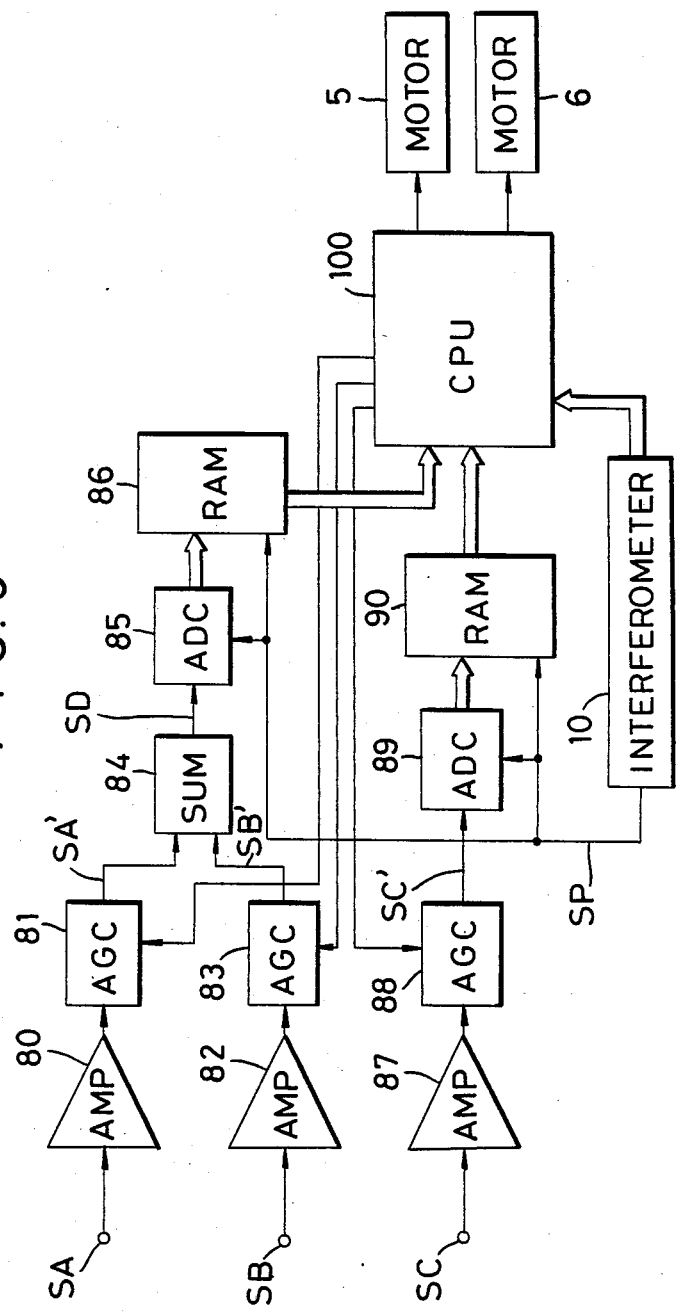
FIG. 8 is a block diagram of a signal processing circuit.

FIG. 8 shows an embodiment of a processing circuit which receives the photo-electric signals SA, SB and SC from the photo-electric elements 67, 69 and 63. The processing circuit is provided in the main control unit 50 and it cooperates with a processor such as a microcomputer or minicomputer to detect the positions of the marks Ma and Mb and the stepped edges $E_1$ and $E_2$. In FIG. 8, the photo-electric signal SA is amplified by a preamplifier 80 having a predetermined amplification factor and an output thereof is applied to a gain control amplifier (AGC circuit) 81, which adjusts a level of the input signal by a preset gain to produce a signal SA'. On the other hand, the photo-electric signal SB is amplified and adjusted by similar preamplifier 82 and AGC circuit 83, which produces a signal SB'. A summing circuit 84 produces a signal SD which is an analog sum of the two signals SA' and SB'. An analog-digital converter (ADC) 85 samples the signal SD and converts it to a digital signal representing the magnitude (level) of the analog signal. A random access memory circuit (RAM) 86 stores the digital signal sampled by the ADC 85 at a designated address. The sampling by the ADC 85 and the addressing of the RAM 86 are done by a pulse signal SP from the laser interferometer 10. The pulse signal SP is a pulse train which is generated one pulse each time the stage 3 is moved by a unit distance (for example, 0.02 μm) in the x-direction. In response to each pulse, the ADC 85 samples once and the address of the RAM 86 is incremented (or decremented) by one.

The photo-electric signal SC is amplified by preamplifier 87 and AGC circuit 88, and a signal SC' therefrom is sampled by an ADC 89 and stored in a RAM 90 in the sequence of address. The sampling by the ADC 89 and the addressing of the RAM 90 are done in response to the pulse of the pulse signal SP from the laser interferometer 10. The processor (CPU) such as the microcomputer or minicomputer receives the digital information from the RAM 86 and the RAM 90 and the x-direction position information of the stage 3 (resolution of which is determined by the unit distance of movement) read by the laser interferometer 10 and processes them by a software to detect the positions of the marks Max and Mbx and the stepped edges $E_1$ and $E_2$. In the present embodiment, the projection image of the reticle R is finally aligned to the chip CP on the wafer W. Thus, the CPU 100 controls the positioning motors 5 and 6 for the stage 3 in accordance with the detected mark position information and edge position information. The CPU 100 also issues commands to individually change the gains of the AGC circuits 81, 83 and 88.

In the RAM 86, the x-direction intensity distribution (photo-electric distribution) of the diffraction lights from the marks Max and Mbx is stored at corresponding locations, and in the RAM 90, the x-direction intensity distribution (photo-electric waveform) of the scattered lights from the stepped edges $E_1$ and $E_2$ or the steps of the marks Max and Mbx which are parallel to the stepped edges $E_1$ and $E_2$ is stored at corresponding locations. The AGC circuit 88 need not be very precise but it may be an amplifier having two or three gain ranges because the intensity of the scattered light may significantly change by an affect of the resist on the wafer W or an underlying material. On the other hand, the AGC circuits 81 and 83 are preferably precise variable gain amplifiers in order to compensate for deformation or degradation of the diffraction grating pattern (marks Ma and Mb) on the wafer W. For example, when the width of the spot light LXS is equal to the width $d_2$ of the marks Max and Mbx and the marks Max and Mbx and the spot light LXS are relatively scanned in the x-direction, the waveforms of the photo-electric signals SA and SB are Gauss waveforms. If the diffraction grating pattern has no deformation or degradation, the sizes of the photo-electric signals SA and SB and the x-direction positions are identical. However, the sizes of the Gauss waveforms of the photo-electric signals SA and SB differ from each other depending on the degree of deformation of the diffraction grating pattern and the x-direction positions also slightly change from each other (positional shift of the photo-electric signals SA and SB). The distortions of the Gauss waveforms of the photo-electric signals may also differ from each other. When the marks Ma and Mb are straight grating patterns as they are in the present embodiment or oblique grating patterns comprising 45° fine line elements as disclosed in U.S. Pat. No. 4,423,959, the difference in the sizes of the Gauss waveforms of the photo-electric signals SA and SB leads to the reduction of the detection precision. In the present embodiment, when the sizes of the waveforms of the photo-electric signals SA and SB are different, the gains of the AGC circuits 81 and 83 are controlled to equalize the sizes of the waveforms of the signals SA' and SB' and they are summed in the summing circuit 84.

Figure 9:
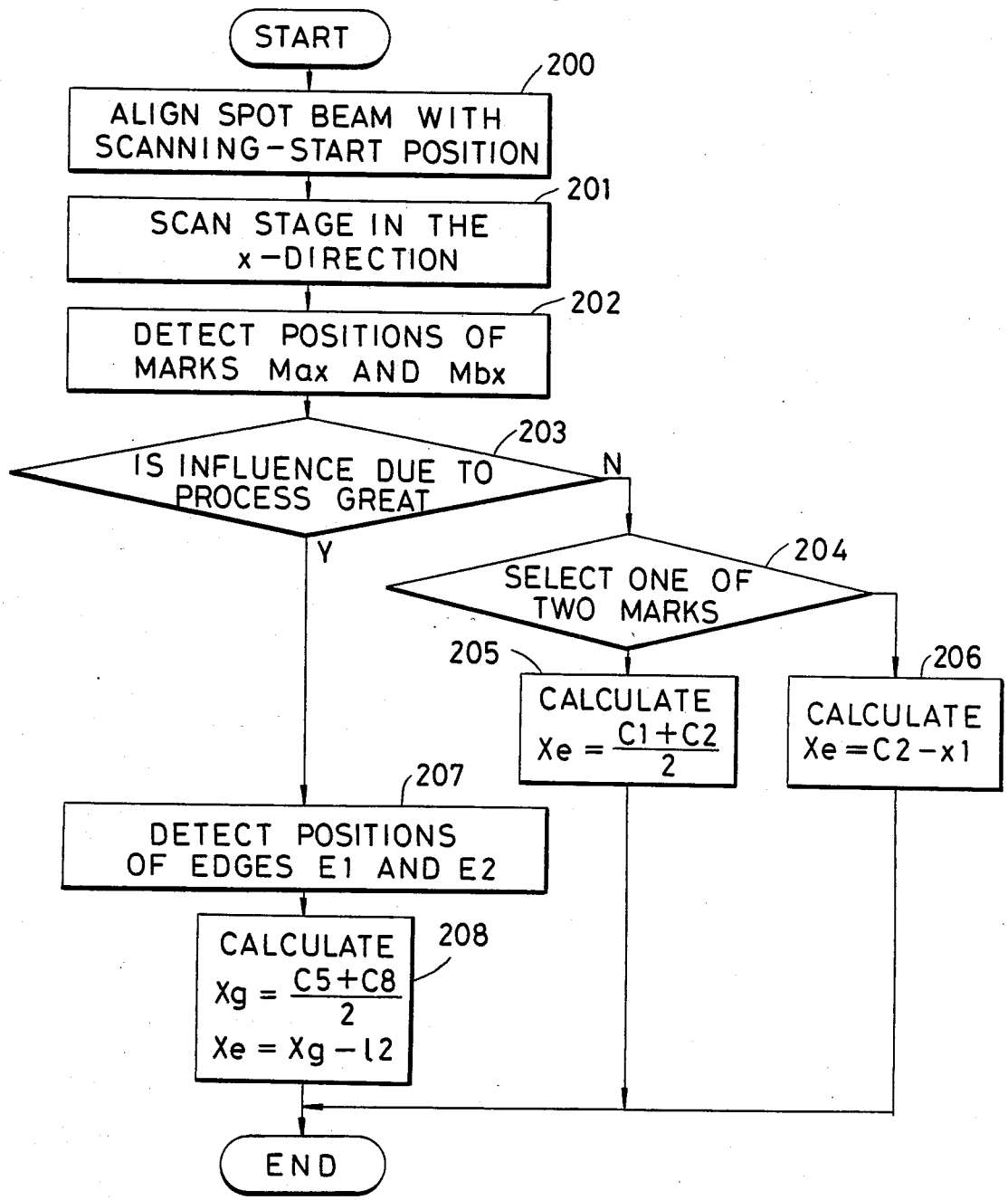
FIG. 9 is a flow chart showing a position detection procedure.

The operation of the present embodiment is explained with reference to a flow chart of FIG. 9. It is assumed that mechanical prealignment and global alignment of the wafer W have been completed and alignment for each chip CP (step alignment) is to be carried out.

Figure 10:
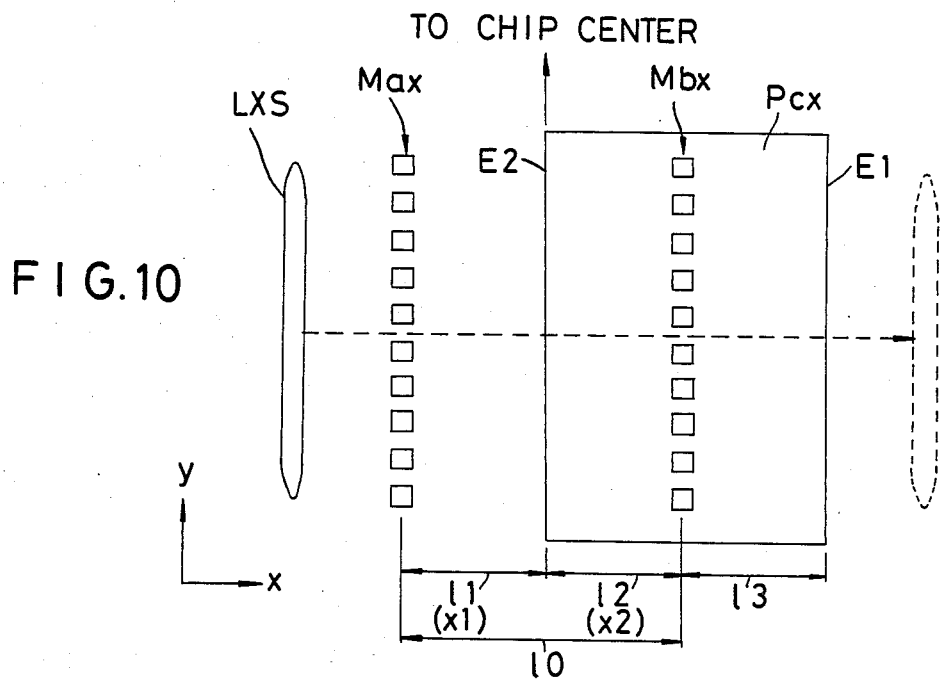
FIG. 10 is a plan view showing a positional relationship between an alignment mark and a spot light.

The CPU 100 first positions the stage 3 so that the x-direction alignment mark of the chip CP to be exposed and the spot light LXS are arranged in parallel (step 200). This is shown in FIG. 10. The spot light LXS is spaced from the mark Max on the left side thereof. The positioning in this step is generally attained with an error of less than 1 μm although it depends on the global alignment precision. The CPU 100 reads the current x-direction position of the stage 3 from the laser interferometer 10 and stores it as a start of scan point Cxo, and instructs the RAM's 86 and 90 to write digital values starting from the address O. The x-direction alignment mark shown in FIG. 10 is same as that shown in FIG. 1. It is assumed that the distances $l_1$ and $l_2$ are equal to the spacing $x_1$. Accordingly, as seen from the mark arrangement shown in FIG. 2, an extended line of the stepped edge $E_2$ passes through the center of the chip CP.

Figure 11A:
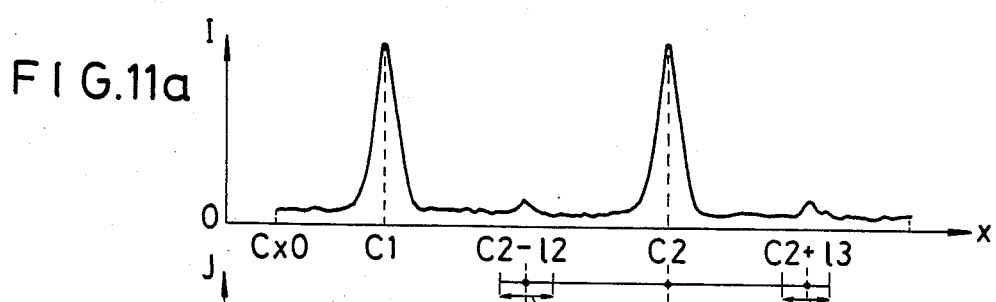
FIGS. 11a–11b shows an intensity distribution of the diffraction light and an intensity distribution of the scattered light.
Figure 11B:
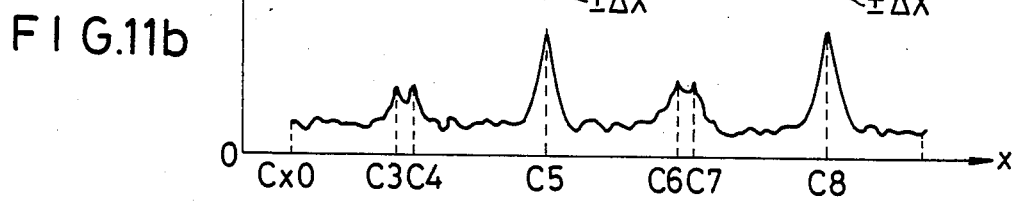

The CPU 100 then starts the relative scan of the spot light LXS and the x-direction alignment mark (step 201). This is done by moving the stage 3 in the x-direction relative to the spot light LXS. This is called a stage scan. The stage scan is carried out over a distance sufficient for the spot light LXS to cross the mark Max, stepped edge $E_2$, mark Mbx and stepped edge $E_1$. The distance is determined by a sum of $l_1$, $l_2$ and $l_3$. For example, it is 100 μm. During the stage scan, the ADC's 85 and 89 sample the signals SD and SC', respectively, and the results are stored in the RAM's 86 and 90 in the order of addresses. When the distance of the stage scan is 100 μm and the sampling interval (increment) is 0.02 μm, the number of sampling points is 5000 (addresses 0–5000). At the end of the stage scan, a distribution waveform as shown in FIG. 11a has been stored in the RAM 86, and a distribution waveform as shown in FIG. 11b has been stored in the RAM 90. In FIGS. 11a and 11b, the abscissas represent the x-positions which are uniquely related to the addresses of the RAM's 86 and 90. The ordinates represent the diffraction light intensity I (level of the signal SD) and the scattering light intensity J (level of the signal SC'). As seen from FIG. 11a, at a point $C_1$ where the spot light LXS coincides with the mark Max, the diffraction light intensity I is peak (peak point of the Gauss waveform), and at a point $C_2$ where the spot light LXS coincides with the mark Mbx, the diffraction light intensity I is peak. The marks Max and Mbx are diffraction gratings in order to enhance a recognition factor for any irregular pattern on the wafer W. If the degradation of the mark geometry is small, an S/N ratio of the peak waveform is fairly high.

The CPU 100 then reads the distribution waveform stored in the RAM 86 to detect the points $C_1$ and $C_2$ (step 202). It may be detected by (a) binarizing the distribution waveform shown in FIG. 11a by a predetermined slice level and detecting the points $C_1$ and $C_2$ by mid-points of the widths of the peak waveforms, (b) primarily differentiating the distribution waveform and detecting the points $C_1$ and $C_2$ by zero-crossing points on the differentiated waveform, or (c) integrating the peak waveforms in the distribution waveform and detecting the points $C_1$ and $C_2$ by centers of gravity of the peak waveforms. Any other detection method may be used.

The CPU 100 then determines if the marks Max and Mbx are on a layer deformed or degraded by the process (step 203). This is done by storing in the CPU what an operator experimentarily knew. For second and third layers, it may be possible that the deformation of the marks by the process is little and the deformation of only the mark Max (convex pattern) is prominent as the process proceeds and in the last layer, the mark Max is significantly degraded and the mark Mbx (concave pattern) is also prominent. In this case, information is stored in the CPU 100 such that both or one of the marks Max and Mbx are used for the second and third layers, only the mark Mbx is used for the subsequent layer, and the stepped edges $E_1$ and $E_2$ in addition to the mark Mbx are used for the last layer together with the scattered light information. If the deformation or degradation of the marks Max and Mbx is not predictable, the conditions of the marks may be observed by a TV camera through the alignment optical system shown in FIG. 3, and an operator instructs an appropriate processing to the CPU 100.

In the step 203, if it is determined that the influence by the process is small and the distortion of the diffraction light signal from the mark Max or Mbx is very small, it is determined whether both or one of the marks Max and Mbx are to be used (step 204). Since the diffraction light photo-electric signal has a high S/N ratio, a high position detection precision is attained if the deformation or degradation is not included. If the both marks Max and Mbx are not deformed, the two marks are used to detect the x-direction position Xe of the alignment mark (step 205). When the spot light LXS is positioned at the mid-point of the marks Max and Mbx, the chip center is aligned to the optical axis AX in the x-direction. Accordingly, the CPU 100 calculates the position Xe in the step 205 in accordance with a formula $$Xe = \frac{C_1 + C_2}{2}$$

If the mark Max has a significant deformation but the mark Mbx has no prominent deformation (or vice versa), only the mark Mbx having little deformation is used to detect the position Xe (step 206). Since the mark Mbx is spaced from a line which is parallel to the y-axis and passes through the chip center by $+x_1$ ($l_2$) in the x-direction, the position Xe is calculated in accordance with a formula $$Xe = C_2 - x_1$$

If it is determined in the step 203 to use the scattered light information as well, the CPU 100 detects positions $C_5$ and $C_8$ corresponding to the peak points created by the edges $E_1$ and $E_2$ in the distribution waveform of the scattered light intensity (step 207) based on the positions $C_1$ and $C_2$ of the marks Max and Mby determined from the distribution waveform of the diffraction light intensity and design value for the distances from the marks Max and Mbx to the stepped edges $E_1$ and $E_2$, respectively. As shown in Fig. 11B, the scattered light is always generated so long as any unevenness or step exists on the wafer W.

In other words, a sensitivity to detect the step on the wafer W is high. The peak waveforms corresponding to the marks Max and Mbx at the positions $C_3$ and $C_4$ and the positions $C_6$ and $C_7$, respectively, are also obtained by the scattered light from the stepped edges of the marks Max and Mbx extending in the y-direction. If the surface of the wafer W is rough, small peak waveforms are generated. If the influence of the process is so large that the marks Max and Mbx are deformed or degraded, the distribution waveform of the scattered light intensity J does not have a high S/N ratio as shown in FIG. 11b and the peak levels are generally low and many noise peaks appear because the intensity of the scattered light signal greatly depends on the inclination of the slope of the stepped edge since, in the present embodiment, the scattered light passing through the vicinity of the normal reflection light beam from the stepped edge is detected on an incident pupil plane. As a result, if the inclination of the slope changes by the influence of the process, the peak waveforms by the stepped edges $E_1$ and $E_2$ are lowered and may be hidden by the noise peak waveforms. Such scattered light information highly reflects the unevenness on the surface of the wafer W, and it is very difficult to detect the positions $C_5$ and $C_8$ of the stepped edges $E_1$ and $E_2$ on the surface of the wafer W even if hardware and software are fully utilized.

In the present embodiment, in the step 207, the CPU 100 calculates design positions of the stepped edges $E_1$ and $E_2$ for the positions $C_1$ and $C_2$ of the mark Max or Mbx. For example, the stepped edge $E_2$ is to be located near the position $(C_1+l_1)$ or $(C_2-l_2)$, and the stepped edge $E_1$ is to be located near the position $(C_2+l_3)$ or $(C_1+l_1+l_2+l_3)$. For the sake of simplicity, the position $(C_2-l_2)$ is used for the edge $E_2$ and the position $(C_2+l_3)$ is used for the edge $E_1$. The CPU 100 examines the distribution waveform of the scattered light intensity shown in FIG. 11b for a small section $\pm\Delta x$ around the calculated position. If any peak exists in the small section $\pm\Delta x$, it must be generated by the edges $E_1$ and $E_2$ and the peak point is detected as the positions $C_5$ and $C_8$ of the edges $E_1$ and $E_2$. By limiting (gating) the search range of the distribution waveform of the scattered light information by using the positions $C_1$ and $C_2$ detected in accordance with the diffraction light information, the positions of the edges $E_1$ and $E_2$ can be precisely detected at a high speed even for a low S/N ratio scattered light information. The small section $\pm\Delta x$ is preferably close to the x-direction width of the spot light LXS.

The CPU 100 calculates an x-direction center position Xg of a rectangular pattern Pcx based on the detected positions $C_5$ and $C_8$ in accordance with a formula $$Xg = \frac{C_5 + C_8}{2}$$

If the distance $l_3$ between the stepped edge $E_1$ and the mark Mbx is equal to the distance $l_2$, the position Xg is also the position $C_2$ of the mark Mbx. However, if the deformation or degradation of the mark Mbx is remarkable and the peaks on the distribution waveform of the diffraction light intensity are small and include much distortions, the position $C_2$ does not necessarily coincide to the center of the mark Mbx. However, the position Xg detected by the method of determining the center of the stepped edges $E_1$ and $E_2$ well coincide with the center of the mark Mbx because the spot light LXS is elongated and the continuous linear stepped edges $E_1$ and $E_2$ are not significantly deformed by the process. This is explained with reference to FIG. 12. It is assumed that small rectangular patterns Pa and Pb of the marks Max and Mby have been deformed by the influence of the process and the stepped edges $E_1$ and $E_2$ of the rectangular pattern Pcx have been deformed roughly or ruggedly. It is also assumed that the stepped edges $E_1$ and $E_2$ have been thinned by a small amount $\Delta\alpha$ from its inherent position. Such a phenomenon is often seen in the wafer process and not a special one. In this case, the peak waveforms for the marks Max and Mbx on the distribution waveform of the diffraction light intensity I have small amplitudes and include distortions. As a result, the positions of the marks Max and Mbx detected are shifted by small amounts $\Delta\beta$ and $\Delta\beta'$ from the design positions. On the other hand, for the edges $E_1$ and $E_2$, shape of edges are rough or rugged but that microscopic roughness or ruggedness are averaged because the spot light LXS extends along the y-axis. The position detection precision for the edge is therefore not lowered much due to the smoothing effect by the belt-shaped spot light. Accordingly, the error of the thinning $\Delta\alpha$ of the edges is cancelled by determining the center of the detection positions for the edges $E_1$ and $E_2$ and the position Xg of the rectangular pattern Pcx is determined very precisely.

The position Xe of the x-direction alignment mark can be calculated (step 208) by the CPU 100 in accordance with a formula $$Xe = Xg - l_2$$

The position Xe of the x-direction alignment mark can be detected by one of the several ways described above, and the result is used by the CPU 100 to control the motor 5 to position the stage 3 in the x-direction. Specifically, the motor 5 is driven to move the stage 3 until the position read from the laser interferometer 10 coincides with the position Xe. Thus, the projection area Pr of the circuit pattern of the reticle R (see FIG. 4) precisely aligns to one of the chips CP in the x-direction. The spot light LYS and the y-direction alignment mark are also relatively scanned in the y-direction to effect position detection and alignment in the same manner.

In the present embodiment, if the deformations of the marks Max and Mbx are small, the marks are used to detect the position, and if the marks include the deformation, the stepped edges are also used to detect the position so that the contrary conditions of high speed processing and high precision detection are balanced.

The operations of the AGC circuits 81 and 83 (see FIG. 8) of the present embodiment are explained in detail. As described above, as the diffraction grating pattern is deformed by the influence of the process, the peak positions of the photo-electric signals SA and SB are slightly shifted and the amplitudes of the signals may differ from each other. FIG. 13 is a plan view showing the deformation of the mark (linear grating) of the diffraction grating. FIG. 13a shows an ideal mark which is free from the deformation. In the present embodiment, it is an aggregation of y-direction convex small rectangular patterns Pa. The edges $EP_1$ and $EP_2$ which contribute to the generation of the diffraction lights $\pm D$ extend along the x-axis and there is no positional shift of the photo-electric signals SA and SB. However, if the direction of the progress of the process obliquely crosses the edges $EP_1$ and $EP_2$ as shown by an arrow 150, the small rectangular pattern Pa has the corners rounded as shown in FIG. 13b and the edges $EP_1$ and $EP_2$ are oblique to align to the direction of the progress of the process. If the thicknesses of the resists applied to the edges $EP_1$ and $EP_2$ of the deformed marks are different from each other, the photo-electric signals SA and SB have the positional shifts and different magnitudes (peak levels) as shown in FIGS. 14a and 14b when they are scanned by the spot light. The photo-electric signal SA has the peak at the position Xa which is shifted from the inherent position $X_o$ of the mark and has the peak value Ia. On the other hand, the photo-electric signal SB has the peak at the position Xb shifted from the position Yo in the opposite direction and has the peak value Ib which is larger than Ia. In this case, the CPU 100 instructs to increase the gain of the AGC circuit 81 (or decrease the gain of the AGC circuit 83) to match the peak value Ia' of the photo-electric signal SA to Ib. That is the magnitudes of the two photo-electric signals are rendered equal as shown on the right half of FIG. 14. The waveforms of the photo-electric signals SA and SB are laterally symmetric in accordance with the Gauss distribution of the spot light. Thus, if the two waveforms retain the symmetries or if one of the waveforms, which is turned over around the position Xo, overlaps to the other waveform and the peak levels of the waveforms are equal, the waveform of the combined signal SD retains the symmetry around the position $X_o$ even if they are shifted from the position $X_o$. On the other hand, if the two waveforms having different peak levels are combined as shown on the left half of FIG. 14, the waveform of the signal SD is asymmetric. The asymmetry of the waveform is a large factor to reduce the detection precision of the center position of the mark.

In the present embodiment, the levels of the photo-electric signals SA and SB are matched to each other by the AGC circuits 81 and 83 so that the high precision position detection is attained even for the deformed mark. The influence of the process may differ on one wafer W depending on the position or direction of the mark on the wafer. Thus, the gains of the AGC circuits 81 and 83 are controlled by the CPU 100 for each coordinate position of the chips on the wafer W so that the chips are precisely aligned on the wafer W. To this end, it is desirable to store in the CPU 100 the gains for the respective coordinates of the chips.

Figure 15:
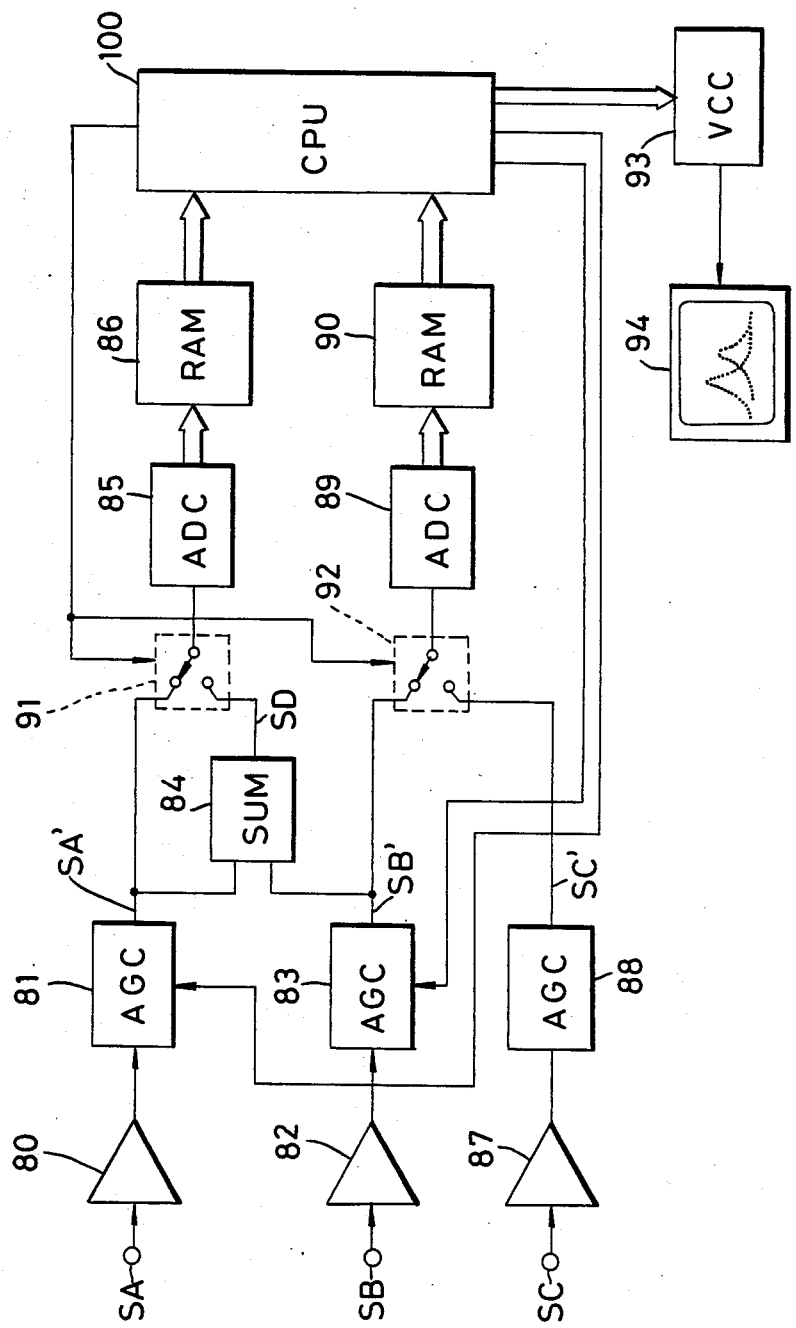
FIG. 15 is a block diagram of another embodiment of the signal processing circuit.

FIG. 15 shows a modification of the signal processing circuit shown in FIG. 8. The like block to those shown in FIG. 8 are designated by the like numerals. Major elements newly added in FIG. 15 are an analog switch 91 which selects the signal SA' or SD under the control of the CPU 100 and supplies the selected signal to the ADC 85, an analog switch 92 which selects the signal SB' or SC' and supplies the selected signal to the ADC 89, a video control circuit (VCC) 93 which converts the distribution waveform data stored in the RAM's 86 and 90 through the CPU 100 to a television video signal, and a CRT monitor 94 which receives the video signal from the VCC 93. The sampling by the ADC's 85 and 89 and the accessing of the RAM's 86 and 90 are carried out in response to the pulse signal from the laser interferometer 10 as are done in FIG. 8.

When the signal processing circuit shown in FIG. 15 is used, the following alignment sequence is preferable.

(1) The wafers are usually managed lot by lot and the wafers in each lot are manufactured under the same condition. Accordingly, the wafers in one lot are influenced by the process in essentially same degree. This means that it is very rare that any geometry degradation of the marks on the wafers in one lot is at random. Thus, the alignment marks Max and Mby of the first wafer in the lot is scanned by the spot light LXS at several shot positions on the wafer before the exposure of the wafer, the waveforms of the signals SA and SB are stored in the RAM's 86 and 90, respectively, and the two waveforms are displayed on the screen of the monitor 94 through the VCC 93. The switches 91 and 92 are set in the positions shown in FIG. 15 and the gains of the AGC circuits 81 and 83 are set to the same level. The operator compares the two waveforms on the screen and determines the gains of the AGC circuits 81 and 83 such that the peak values of the signals SA' and SB' are equal and the S/N ratios in the input range of the ADC's 85 and 89 are high. The operator sets new gains of the AGC circuits 81 and 83 through the CPU 100. Then, the alignment marks Max and Mbx are scanned by the spot light LXS and the waveforms of the signals SA' and SB' are displayed on the screen of the monitor 94 so that the operator can check the magnitudes of the peak values.

(2) Then, the switches 91 and 92 are switched from the positions shown in FIG. 15 and the alignment operation is carried out to complete the step-and-repeat exposure process for the first wafer.

(3) For the second and subsequent wafers in the lot, the switches 91 and 92 are kept in the positions of the step (2). The distribution waveform of the signal SD' is stored in the RAM 86 and the distribution waveform of the signal SC' is stored in the RAM 90.

The lenes of the signals SA' and SB' may be adjusted automatically by the software processing by the CPU 100 instead of the adjustment by the operator through the observation on the screen of the monitor 94.

Other embodiments of the present invention are now explained.

Figure 16:
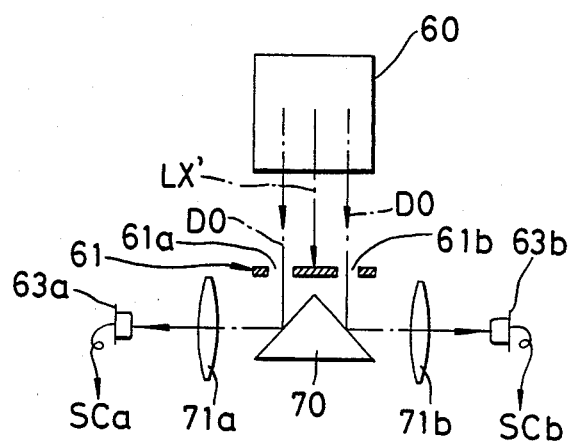
FIG. 16 shows another embodiment of the scattered light information receiving unit.

Since the alignment marks and the spot light may be relatively scanned, the spot light may be reciprocally scanned or linearly scanned relative to the alignment marks by a vibrating mirror or a rotating polygon mirror. The same is true when the alignment marks of the wafer W are detected by a microscope without routing the projection lens 1. The photoelectric element 63 which receives the scattered light shown in FIG. 5 is preferably divided into two portions corresponding to the two openings 61a and 61b of the spatial filter 61. More specifically, as shown in FIG. 16, a reflection prism 70 similar to the prism 65 is arranged behind the spatial filter 61 shown in FIG. 5, and a lens 71a which focuses the scattered light Do transmitted through the aperture 61a and a photo-sensing element 63a are arranged, and a lens 71b which focuses the scattered light Do transmitted through the aperture 61b and a photo-sensing element 63b are arranged. The photo-electric signals SCa and SCb of the photo-sensing elements 63a and 63b are amplified and they are converted to digital signals by separate analog-digital converters and they are stored in separate memories. When the position of the stepped edge E$_1$ is to be detected by the CPU 100, the waveform of the photo-electric signal from the photo-sensing element 63a is used, and when the position of the stepped edge E$_2$ is to be detected, the waveform of the photo-electric signal from the photo-sensing element 63b is used. In this manner, the position detection precision for the stepped edges is improved.

Figure 17A:
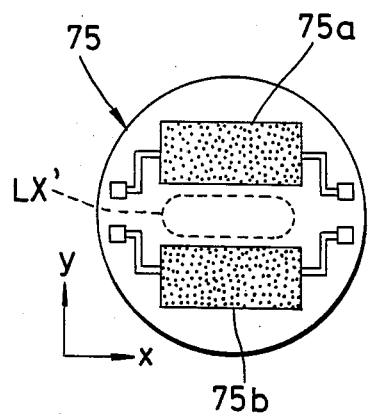
FIGS. 17a and 17b are plan views of other embodiments of photo-sensing elements which sense the diffraction light information and the scattered light information.

As shown in FIG. 17a, a dual type photo-electric element 75 having two photo-sensing planes 75a and 75b for receiving the diffraction lights +D and −D on the same semiconductor substrate may be arranged at the position of the spatial filter 64 instead of the photo-electric elements 67 and 69 for detecting the diffraction lights. The photo-electric element 75 is arranged in conjugation with the incident pupil of the projection lens 1 such that the light beam distribution LX' of the normal reflection light from the wafer W of the spot light LXS is located between the photo-sensing planes 75a and 75b.

Figure 17B:
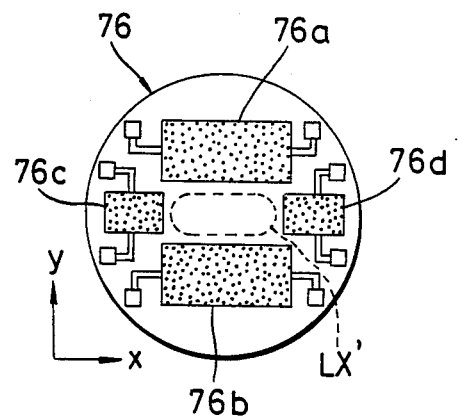

The light information directed to the prism 60 shown in FIG. 5 includes spatially separated diffraction light and scattered light. As shown in FIG. 17b, photo-sensing planes 76a and 76b which receive the diffraction lights +D and −D, respectively, may be formed on the same semiconductor substrate and a quod type photo-electric element 76 having two photo-sensing planes 76c and 76d (corresponding to the photo-sensing elements 63a and 63b of FIG. 16) for receiving the scattered light Do formed thereon may be arranged instead of the prism 60 in conjugation with the incident pupil of the projection lens 1. Since the electric characteristics of the photo-electric elements are same, the aging error is small and stable photo-electric detection is attained.

The photo-electric element for detecting the scattered light may not sense the scattered light transmitted through the projection lens or the microscope object lens but may be divided into a plurality of portions, which are arranged around the lens shown in U.S. Pat. No. 4,112,309.

The photo-electric signals SA and SB from the photo-electric elements 67 and 69 for detecting the diffraction light (or photo-sensing planes 75a, 75b, 76a and 76b) are analogously combined by the summing circuit 84. Alternatively, they may not be combined. In this case, the waveforms of the photo-electric signals SA and SB are stored in separate memories and the peak positions (or center of gravity positions) of the two waveforms (corresponding to FIG. 14) are detected on the memories and the center position of the diffraction grating marks is determined by averaging the both positions. The peak levels of the waveforms on the memories may be normalized and they may be digitally added to achieve the functions of the summing circuit 84 and the AGC circuits 81 and 83 by software.

Figure 18:
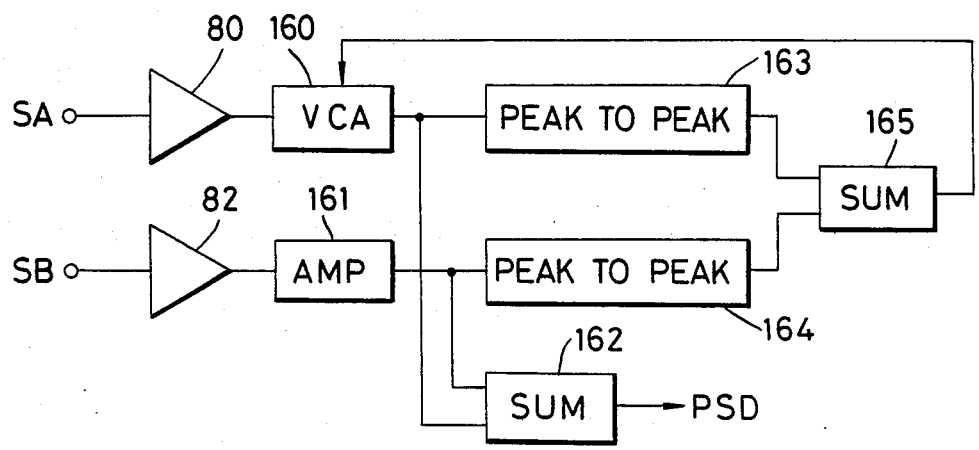
FIG. 18 shows a gain control circuit in a phase synchronization detection system signal processing circuit.

As described above, when the vibration mirror is used to vibrate the spot light in a small amplitude, the diffraction grating marks or the stepped edges may be detected by synchronously detecting the photo-electric signals as the laser scan type photo-electric microscope does. In this case, a processing circuit as shown in FIG. 18 may be used to process the photoelectric signals SA and SB from the photo-electric elements 67 and 69 (or photo-sensing planes 75a, 75b, 76a and 76b).

The pre-amplifiers 80 and 82 amplify the modulated photo-electric signals SA and SB. The amplified photo-electric signal is applied to a voltage controlled amplifier (VCA) 160 which is similar to the AGC circuit 81, 83 or 88. On the other hand, the amplified photo-electric signal SB is applied to an amplifier 161. The output signal of the VCA 160 and the output signal of the amplifier 161 are applied to an analog adder 162 where they are summed, and the sum signal is supplied to a phase synchronous detector (PSD). Since the output signal of the VCA 160 and the output signal of the amplifier 161 are both A.C. signals, they are applied to peak-to-peak detectors (P-P detectors) 163 and 164, respectively, which produce analog voltages representing absolute values of differences between maximums and minimums of the respective A.C. waveforms. A differential amplifier 165 produces a control voltage which represents a difference between the analog voltages from the P-P detectors 163 and 164. The differential amplifier 165 produces the control signal (voltage) to control an amplification factors of the VCA 160 such that the analog voltages from the P-P detectors 163 and 164 are rendered equal.

With this processing circuit, even if the diffraction grating marks are deformed and the positional shift and the level difference exist between the waveforms of the photo-electric signals SA and SB, the output signal of the VCA 160 and the output signal of the amplifier 161 are always of the same level while the spot light vibration-scans the marks, so that the position detection precision by the PSD is kept constant.

Figure 19:
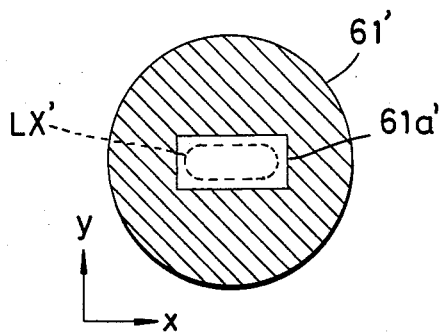
FIG. 19 is a plan view showing a geometry of a spatial filter for detecting a normal reflection light.

The normal reflection light by the spot light LXS (LYS) may be photo-electrically detected instead of detecting the scattered lights from the stepped edges $E_1$ and $E_2$. In this case, the spatial filter 61 shown in FIG. 6 in the arrangement of FIG. 5 may be replaced by a spatial filter 61' as shown in FIG. 19. The spatial filter 61' has an aperture 61'a which complies with the normal reflection light distribution LX' of the spot light LXS on the incident pupil of the projection lens 1. With such spatial filter 61', the photo-electric signal SC of the photo-electric element 63 has a minimum (bottom) level at the steps of the stepped edges $E_1$ and $E_2$ and other steps, and has a flat level at a planar area. It is difficult to precisely detect the stepped edges $E_1$ and $E_2$ by using only those waveforms because of the influence by the process, but by the processing shown in FIG. 9, the positions of the stepped edges $E_1$ and $E_2$ can be readily detected by gating the normal reflection light information in accordance with the diffraction light information. Instead of arranging the spatial filter 61', a photo-electric element may be arranged at a position at which the normal reflection light LX' is directed on the semiconductor substrate 76 shown in FIG. 17b. In this case, all light information can be detected at one position.

Figure 20:
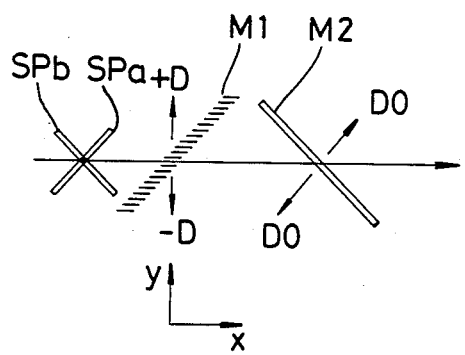
FIG. 20 is a plan view showing other geometries of the alignment mark and the spot light.

The shape of other alignment mark and the shape of other spot light which are suitable for position detection are explained. In the alignment mark shown in FIG. 1, the mark Ma which is the aggregation of the convex small rectangular patterns Pa may be omitted. In this case, since only the diffraction grating pattern mark Mb is used, it is preferable to detect the position by using the stepped edges $E_1$ and $E_2$ (steps 207 and 208 in FIG. 9). Instead of the rectangular pattern Pc for the stepped edges $E_1$ and $E_2$, a simple linear mark (bar mark) such as a mark $M_2$ shown in FIG. 20 may be used and it may be arranged anywhere near the diffraction grating pattern. The stepped edges and the diffraction grating mark need not be parallel but they may cross at any angle. One example is shown in FIG. 20 in which the mark $M_1$ is a diffraction grating pattern inclined to the x and y-axes by 45 degrees and the small line elements extend in the x-direction. The mark $M_2$ is a bar mark which crosses the mark $M_1$ at 90 degrees. On the other hand, the spot lights SPa and SPb for detecting the alignment mark are belt-shaped spots which cross at 90 degrees and they simultaneously scan the alignment mark. The scan direction is in the x-direction. In this arrangement, when the spot lights SPa and SPb cross the mark $M_1$, the diffraction lights $\pm D$ are generated because the spot light SPa and the mark $M_1$ are in the same direction. As the scan proceeds and the spot light SPa and SPb cross the mark $M_2$, the scattered light $D_o$ is generated from the straight edge of the mark $M_2$ because the spot light SPb and the mark $M_2$ are in the same direction. The scattered light information is gated in accordance with the diffraction light information in the same manner as that of the previous embodiment so that the high precision position detection is attained.

In accordance with the present invention, the diffraction grating marks and the stepped edges are arranged on the substrate (wafer) whose position is to be detected, and the position of the substrate is detected based on the diffraction light information from the grating marks and the light information (scattered light or normal reflection light) whose level changes in accordance with the stepped edges so that the reduction of the detection precision due to the deformation of the marks of the process for the substrate is suppressed.

Since the photo-electric detector for sensing the diffraction light and the photo-electric detector for sensing the scattered light (or normal reflection light) are separately provided, the diffraction light information and the scattered light information can be independently processed and optimum detection algorithms for the respective mark geometries (diffraction gratings and stepped edges) may be used.

What is claimed is:
1. A method for detecting a position of a substrate by irradiating positioning patterns on the substrate by a light beam and detecting unique light information generated by the patterns, comprising steps of:
   (a) forming first pattern and second pattern at different positions on the substrate,
   said first pattern being a diffraction grating having a plurality of grating elements regularly arranged in a second direction crossing to a first direction on the substrate,
   said second pattern being a stepped edge spaced from said first pattern and extending in a third direction crossing the first direction;
   (b) scanning said first pattern and said second pattern in said first direction with said light beam relatively;
   (c) individually detecting first unique light information generated by said first pattern and second unique light information generated by said second pattern; and
   (d) detecting the position of said substrate in accordance with said first light information, said second light information and the relative scan position information of said substrate and said light beam.

2. A method for detecting a position of a substrate according to claim 1 wherein said diffraction grating and said stepped edge are parallel so that said second direction and said third direction coincide, a shape of a spot of said light beam on said substrate is stripe-shaped parallel to said diffraction grating and said stepped edge, and a diffraction light of other than O-order generated when the belt-shaped spot light irradiates the diffraction grating is detected as said first light information and a scattered light generated when the belt-shaped spot light irradiates the stepped edge is detected as said second light information.

3. A method for detecting a position of a substrate according to claim 1 wherein said first pattern is a recess formed at a predetermined position in a land slightly projecting from the surface of said substrate, and the steps around said land are detected as said second pattern.

4. A method for detecting a position of a substrate according to claim 1 wherein the relative scan position at which said first light information is generated is detected, an area spaced from said relative scan position by the distance between said first pattern and said second pattern, including a neighbourhood thereof, is defined, and the position of said substrate is detected in accordance with said second light information generated from said area.

5. A method for detecting a position of a substrate having a diffraction grating formed thereon, said diffraction grating having a plurality of grating elements regularly arranged in a second direction crossing a first direction, comprising steps of:
    (a) forming on said substrate in a predetermined positional relationship to each other a first diffraction grating having a plurality of grating elements slightly projecting from the surface of said substrate arranged in said second direction and a second diffraction grating having a plurality of grating elements slightly recessing from the surface of said substrate arranged in said second direction;
    (b) scanning a stripe-shaped spot light extending in said second direction relative to said substrate in said first direction while said spot light irradiates said substrate; and
    (c) photo-electrically detecting one of a first diffraction light generated by said first diffraction grating by said scan and a second diffraction light generated by said second diffraction grating and determining the position of said substrate in accordance with the photo-electrically detected information and the relative scan position information.

6. A method for detecting a position of a substrate according to claim 5 wherein the diffraction light from one of said first diffraction grating and said second diffraction grating which includes less geometry degradation due to a process for said substrate is detected.

7. An apparatus for detecting a position of a substrate by irradiating positioning patterns formed on said substrate by a light beam and detecting unique light information generated by said patterns, comprising:
    (a) substrate holding means for holding said substrate, said substrate including a first diffraction grating pattern having a plurality of grating elements regularly arranged in a second direction crossing a first direction and a second stepped edge pattern spaced from said first pattern in the first direction and extending in a third direction crossing the first direction;
    (b) spot light irradiation means for irradiating a stripe-shaped spot light extending in said second or third direction onto said substrate;
    (c) scan means for scanning said stripe-shaped spot light relative to said substrate in said first direction;
    (d) first photo-electric detection means for detecting a diffraction light generated when said stripe-shaped spot light irradiates said first pattern to produce a first photo-electric signal representing an intensity of the diffraction light;
    (e) second photo-electric detection means for detecting a reflection light generated when said stripe-shaped spot light is irradiated to said second pattern to produce a second photo-electric signal representing an intensity of the reflection light; and
    (f) position detection means for detecting a first position at which said stripe-shaped spot light irradiates said first pattern and a second position at which said stripe-shaped spot light irradiates said second pattern based on said first and second photo-electric signals to detect the position of said substrate to the spot light based on said first and/or second positions.

8. An apparatus for detecting a position of a substrate according to claim 7 wherein said position detection means includes a signal processing circuit for detecting said first position in accordance with a waveform of said first photo-electric signal and detecting said second position in accordance with a waveform in an area including a position spaced from said first position.

9. An apparatus for detecting a position of a substrate according to claim 8 further comprising pulse generation means for generating a pulse signal each time said belt-shaped spot light is relatively moved by an increment on said substrate in cooperation with said scan means, wherein said signal processing circuit includes memories for sampling said first and second photo-electric signals, respectively, in response to said pulse signal, converting the waveforms thereof to digital signals and storing said digital signals separately.

10. An apparatus for detecting a position of a substrate according to claim 7 wherein said position detection means includes means for selecting a first mode in which the position of said substrate is detected by detecting said first position based on the waveform of said first photo-electric signal or a second mode in which the position of said substrate is detected by evaluating the waveform of said second photo-electric signal with reference to said first position detected based on the waveform of said first photo-electric signal to detect said second position.

11. An apparatus for detecting a position of a substrate having first pattern and second pattern arranged in a predetermined relationship, said first pattern being a diffraction grating having a plurality of grating elements regularly arranged in a second direction crossing a first direction, and said second pattern having a stepped edge extending in a third direction crossing said first direction, said apparatus comprising:
    (a) a focusing optical system for forming a spot light on said substrate;
    (b) scan means for scanning said spot light relatively to said substrate in said first direction;
    (c) a pair of first photo-electric detection means for detecting those plus-order light and minus-order light of diffraction lights from said first pattern transmitted through said focusing optical system which are formed on a pupil plane of said focusing optical system or a conjugate plane thereof;
    (d) second photo-electric detection means for detecting that scattered light of light information from said second pattern transmitted through said focusing optical system which is generated by said stepped edge and formed on said pupil plane or the conjugate plane thereof; and (e) detection means for detecting the position of said substrate in accordance with at least one of a pair of photo-electric signal from said first photo-electric detection means and a photo-electric signal from said second photo-electric detection means.

12. An apparatus for detecting a position of a substrate according to claim 11 wherein said first photo-electric detection means and said second photo-electric detection means comprise a plurality of semiconductor photo-sensing elements formed on one semiconductor substrate, and said plurality of semiconductor photo-sensing elements are arranged essentially conjugate with a pupil of said focusing optical system and electrically isolated on said semiconductor substrate to individually photoelectrically detect the plus-order light, minus-order light and scattered light.

* * * * *